United States Patent
Thyagarajan et al.

(10) Patent No.: US 9,117,508 B2
(45) Date of Patent: Aug. 25, 2015

(54) INTEGRATED CIRCUIT WITH ADAPTIVE POWER STATE MANAGEMENT

(71) Applicant: Rambus Inc., Sunnyvale, CA (US)

(72) Inventors: Vidhya Thyagarajan, Bangalore (IN); Sudhir Shetty, Bangalore (IN)

(73) Assignee: RAMBUS INC., Sunnyvale, CA (US)

( * ) Notice: Subject to any disclaimer, the term of this patent is extended or adjusted under 35 U.S.C. 154(b) by 305 days.

(21) Appl. No.: 13/726,433

(22) Filed: Dec. 24, 2012

(65) Prior Publication Data

US 2013/0188436 A1 Jul. 25, 2013

Related U.S. Application Data

(60) Provisional application No. 61/588,540, filed on Jan. 19, 2012.

(51) Int. Cl.
*G11C 5/14* (2006.01)

(52) U.S. Cl.
CPC ...................... *G11C 5/148* (2013.01)

(58) Field of Classification Search
USPC ......................................... 365/227, 226, 229
See application file for complete search history.

(56) References Cited

U.S. PATENT DOCUMENTS

| | | | |
|---|---|---|---|
| 7,152,138 B2 * | 12/2006 | Spencer et al. | 711/103 |
| 7,194,561 B2 | 3/2007 | Weber | |
| 7,418,534 B2 * | 8/2008 | Hayter et al. | 710/104 |
| 7,724,602 B2 | 5/2010 | Hur et al. | |
| 7,739,461 B2 | 6/2010 | Hur et al. | |
| 7,930,564 B2 | 4/2011 | Arai et al. | |
| 8,589,700 B2 * | 11/2013 | Herman et al. | 713/193 |
| 8,612,834 B2 * | 12/2013 | Kwok et al. | 714/781 |
| 2010/0031075 A1 | 2/2010 | Kapil | |
| 2010/0058078 A1 | 3/2010 | Branover et al. | |
| 2010/0211935 A1 | 8/2010 | Weber et al. | |

OTHER PUBLICATIONS

Aho et al., "A Case for Multi-channel Memories in Video Recording", Nokia Reasearch Center, Tampere, Finland, dated May 5, 2009. 6 Pages.
CoreLink, Intelligent System IP by ARM, "Maximizing Off-Chip Memory Performance", dated May 2011. 40 Pages.
Huang, Hai et al., "Improving Energy Efficiency by Making DRAM Less Randomly Accessed," ISLPED 2005, Aug. 8-10, 2005, San Diego, CA. 6 pages.
Pisharath, J. et al., "Energy Management Schemes for Memory-Resident Database Systems," CIKM 2004, Nov. 8-13, 2004, Washington DC. 10 pages.
Sonics, Inc., MemMax DRAM Systems, Datasheet, dated Feb. 16, 2010. 2 Pages.

* cited by examiner

*Primary Examiner* — Pho M Luu
(74) *Attorney, Agent, or Firm* — Park, Vaughan, Fleming & Dowler LLP

(57) ABSTRACT

Methods and apparatuses that relate to an integrated circuit (IC) with adaptive power state management are described. The IC can be coupled with, and can control the operation of, a memory device. The IC and the memory device can be operated in multiple operational states, wherein each operational state may represent a tradeoff point between performance and power consumption. The IC may be capable of: (1) changing the operational state of the IC and/or the operational state of the memory device based on the occurrence of one or more conditions, and/or (2) changing the one or more conditions based on measuring one or more performance values associated with the IC and/or the memory device.

23 Claims, 7 Drawing Sheets

INTEGRATED CIRCUIT WITH ADAPTIVE POWER STATE MANAGEMENT

RELATED APPLICATION

This application claims priority under 35 U.S.C. §119 to U.S. Provisional Application No. 61/588,540, entitled "Integrated Circuit with Adaptive Power State Management," by Vidhya Thyagarajan and Sudhir Shetty, filed 19 Jan. 2012, the contents of which are herein incorporated by reference in their entirety.

BACKGROUND

This disclosure generally relates to electronic circuits. An integrated circuit (IC) can have multiple operational states with different performance and power consumption profiles. If the IC enters a low power state too frequently, it may degrade performance. On the other hand, if the IC enters a low power state too infrequently, it may waste power.

DETAILED DESCRIPTION

Some embodiments presented in this disclosure feature an IC with adaptive power state management. The IC can be coupled with, and can control the operation of, a memory device. In some embodiments described herein, the IC and/or memory device can be operated in multiple operational states, wherein each operational state may represent a tradeoff point between performance and power consumption. In some embodiments described herein, the IC may be capable of: (1) changing its operational state and/or the operational state of the memory device based on a set of conditions, and/or (2) changing the set of conditions based on measuring one or more performance values associated with the IC and/or the memory device.

Figure 1:
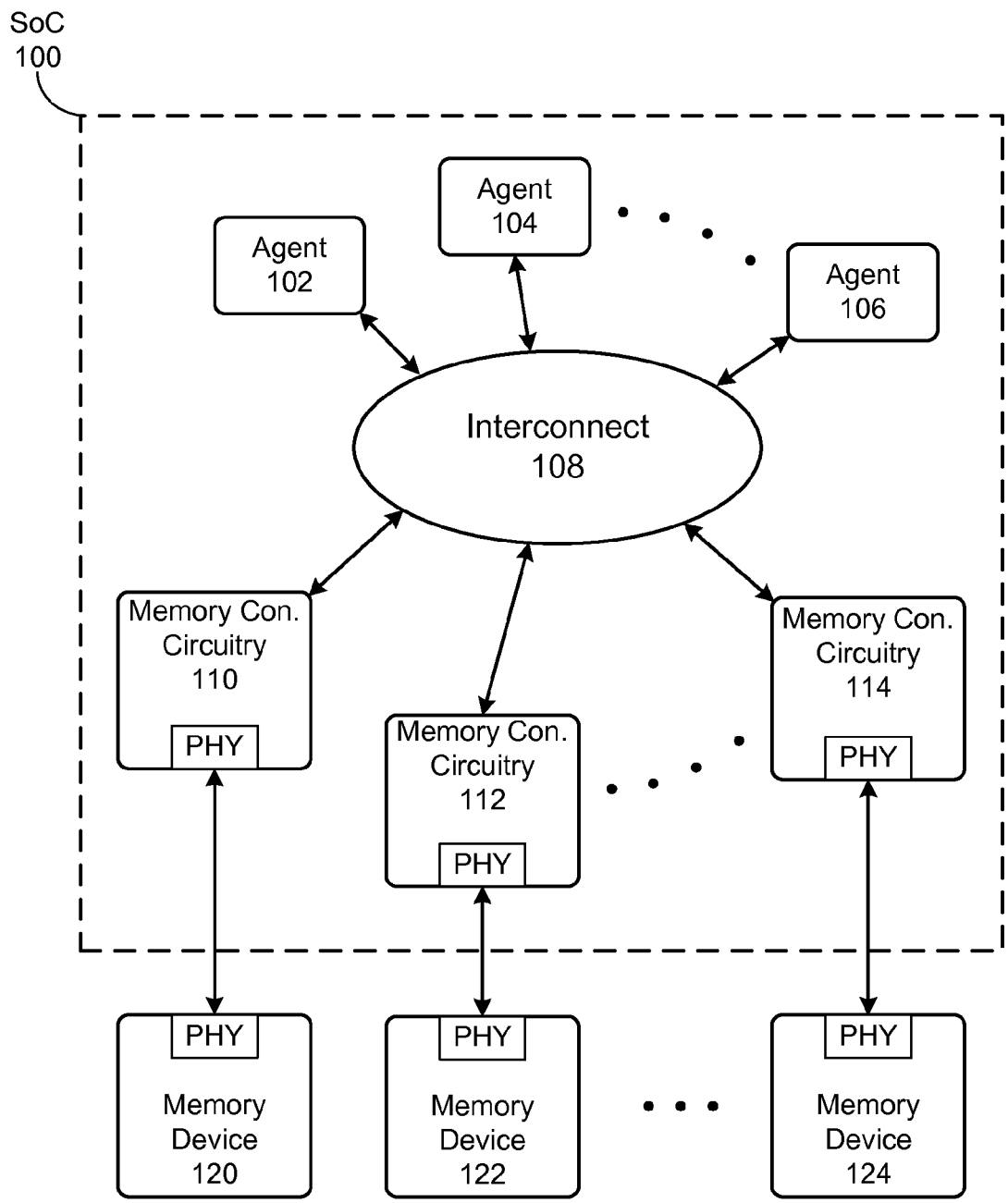
FIG. 1 illustrates a system in accordance with some embodiments described herein.

FIG. 1 illustrates a system in accordance with some embodiments described herein.

In some embodiments described herein, the system can include: one or more agents, e.g., agents 102-106; one or more interconnects, e.g., interconnect 108; one or more memory controller circuitries 110-114; and one or more memory devices, e.g., memory devices 120-124.

The term "memory controller circuitry" can refer to circuitry that is capable of controlling the operation of a memory device. For example, memory controller circuitries 110, 112, and 114, can be coupled with, and can control the operation of, memory devices 120, 122, and 124, respectively. Memory controller circuitry can generally be included in any IC or IC die.

The term "memory controller device" can refer to an IC or IC die that includes memory controller circuitry. A memory controller device may also include other circuitry that implements additional functionality.

In some embodiments, communication between memory controller circuitry and a memory device can be accomplished using physical interface (PHY) circuitry that is part of the respective memory controller circuitry and memory device.

In some embodiments described herein, the system illustrated in FIG. 1 can be implemented using one or more IC packages, and/or one or more printed circuit boards (PCBs). Specifically, in some embodiments described herein, one or more agents 102-106, interconnect 108, and one or more memory controller circuitries 110-114 can be implemented on a single die as a system on a chip (SoC) 100. An IC package may include multiple dies, wherein one die is a memory device and another die includes memory controller circuitry.

In some embodiments described herein, an agent, e.g., agent 102, can generally include any circuitry that accesses one or more memory devices. Examples of agents include, but are not limited to, a central processing unit (CPU), a graphics processing unit (GPU), a network processor, a cryptographic accelerator, a peripheral controller, a display controller, a video codec, an audio codec, a direct memory access (DMA) controller, a digital signal processing (DSP) cores, hardware accelerators, or generally any circuitry that is designed to perform digital, analog, mixed-signal, and/or radio-frequency functions.

In some embodiments described herein, an interconnect, e.g., interconnect 108, can generally be any mechanism that enables an agent and a memory controller circuitry to communicate with one another. In some embodiments described herein, an interconnect can include electrical and/or optical components. Examples of communication mechanisms that may be used in the interconnect include, but are not limited to, a set of point-to-point connections, one or more buses, and/or one or more crossbar switches.

According to one definition, the term "memory device" refers to any IC or IC die whose primary function is the storage and retrieval of data. Examples of memory devices include, but are not limited to, a volatile memory IC (e.g., a dynamic random-access memory (DRAM) IC, a synchronous double data rate (DDR) DRAM IC, etc.), a non-volatile memory IC (e.g., a flash memory IC), and a die that includes one or more volatile and/or non-volatile memory ICs.

An IC can change its own operational state and/or change the operational state of the memory device that is controlled by the IC. Changing the operational state of an IC and/or a memory device may include changing the operational state of the PHY circuitry that is used for communicating between the IC and the memory device. Different operational states of the IC and/or the memory device may have different performance and power consumption profiles, and may represent different tradeoff points between performance and power consumption.

An agent (e.g., agent 102) can send a memory request via an interconnect (e.g., interconnect 108) to memory controller circuitry (e.g., memory controller circuitry 110) to access a memory device (e.g., memory device 120). The memory controller circuitry (e.g., memory controller circuitry 110) can service the memory request by attempting to perform the requested operation (e.g., by reading from and/or writing to a set of memory locations), and sending a response to the agent (e.g., agent 102) via the interconnect (e.g., interconnect 108). The response may include a status indicator that indicates whether or not the memory request was successfully performed, and may also include data associated with servicing the memory request (e.g., the data that was read from the requested memory locations in the memory device).

Figure 2:
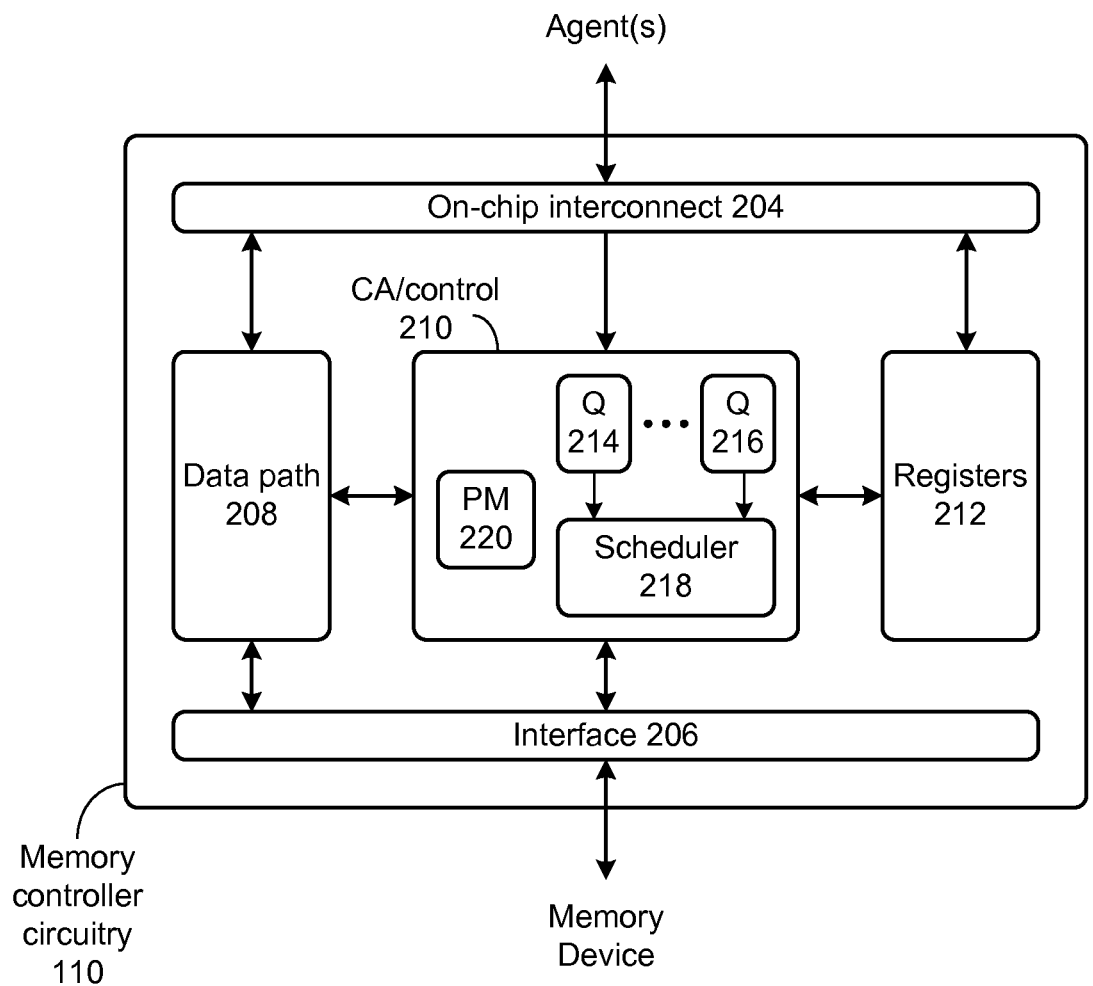
FIG. 2 illustrates memory controller circuitry in accordance with some embodiments described herein.

FIG. 2 illustrates memory controller circuitry, e.g., memory controller circuitry 110, in accordance with some embodiments described herein. The memory controller circuitry illustrated in FIG. 2 is for illustration purposes only, and is not intended to limit the scope of the present disclosure.

In some embodiments described herein, memory controller circuitry 110 can include, inter alia, on-chip interconnect 204, data path circuitry 208, command-and-address and/or control (CA/control) circuitry 210, registers 212, and interface circuitry 206.

On-chip interconnect 204 can enable memory controller circuitry 110 to communicate with agents, and interface circuitry 206 can enable memory controller circuitry 110 to communicate with the memory device. Registers 212 can store information that is used by CA/control circuitry 210. Data path circuitry 208 can route data between on-chip interconnect 204 and interface circuitry 206 based on control information provided by CA/control circuitry 210.

In some embodiments described herein, CA/control circuitry 210 can include, inter alia, one or more queues, e.g., queues 214-216, scheduler 218, and power management (PM) circuitry 220.

In some embodiments described herein, CA/control circuitry 210 can receive memory requests (e.g., memory read and/or write requests) from one or more agents through on-chip interconnect 204 (if an agent and a memory controller reside on the same die, then an on-chip interconnect may not be required for the agent and the memory controller circuitry to communicate with each other). CA/control circuitry 210 can then process the memory requests and place the memory requests in queues 214-216 based on a number of factors, which can include, but are not limited to, the identity of the requesting agent, a priority level associated with the memory request, the type of the memory request, and/or the content of the memory request. In some embodiments described herein, each queue in queues 214-216 can be associated with an agent, a priority level, or a combination thereof. Each queue may be associated with a queuing discipline (e.g., first-in-first-out, last-in-last-out, priority-based queuing, etc.), which may be configurable. The memory requests in the queue may be managed by CA/control circuitry 210 according to the queuing discipline.

In some embodiments described herein, scheduler 218 can select memory requests from queues 214-216 for execution according to a scheduling discipline. Specifically, scheduler 218 may select a memory request from queues 214-216 based on a number of factors, which can include, but are not limited to, the identity of the queue, the memory locations accessed by the memory request, the type of the memory request, and/or the content of the memory request. Next, CA/control circuitry 210 can execute the selected memory request by providing the appropriate control information to data path circuitry 208 and the appropriate command and/or address information to the memory device through interface 206.

In some embodiments described herein, registers 212 may store a set of performance values that specify a set of quality of service (QoS) agreements. These values may include a set of threshold, minimum, maximum, optimal, and/or target values of various parameters and/or performance metrics. An agent (e.g., a CPU) or an operating system may provide these values to the memory controller circuitry.

In some embodiments described herein, an IC can include circuitry to count idle clock cycles and/or measure performance values during the operation of the memory controller circuitry and/or memory device. In some embodiments, the circuitry that is capable of measuring performance values may partly reside in an agent (e.g., agent 102 may include circuitry to measure queue occupancy), and the agent may communicate the measured performance values to the memory controller circuitry (e.g., memory controller circuitry 110).

According to one definition, the term "performance values," as used in this disclosure, can generally refer to the values of measurable entities in the system that can be used to determine whether or not the current performance level of the memory controller circuitry and/or the memory device is expected to allow the end applications to operate as desired. For example, to achieve a desired frame rate, a video application may require the memory controller circuitry and/or memory device to provide a minimum bandwidth. This minimum required bandwidth may be referred to as a quality of service ("QoS") agreement and, in some embodiments described herein, this QoS agreement may be specified by storing the minimum required bandwidth value in a register in the IC.

Examples of performance values that can be measured include, but are not limited to, the current/maximum/average queue occupancy for each queue in the CA/control circuitry 210, the latency for servicing memory requests for each agent and/or priority level, the bandwidth provided to each agent and/or priority level, and any other measurable entities that relate to the performance of the memory controller circuitry and/or memory device. The measured performance values can be stored in registers (e.g., registers that are internal to CA/control circuitry 210 and/or registers 212), and/or be directly provided to PM circuitry 220.

In some embodiments described herein, PM circuitry 220 can be capable of adaptively changing the operational state of memory controller circuitry 110 and/or the memory device based on the measured performance values and/or the stored performance values that specify the QoS agreements. In some embodiments described herein, PM circuitry 220 can be capable of using the measured performance values to adaptively change the conditions under which PM circuitry 220 changes the operational state of memory controller circuitry 110 and/or the memory device.

In some embodiments described herein, PM circuitry 220 can compare the measured performance values with the stored performance values that specify the QoS agreements to determine whether one or more QoS agreements were violated. If one or more QoS agreements were violated, PM circuitry 220 can transition the memory controller circuitry and/or memory device to an operational state that has a higher performance profile (and possibly a higher power consumption profile). On the other hand, if none of the QoS agreements were violated, PM circuitry 220 can transition the memory controller circuitry and/or memory device to an operational state that has a lower power consumption profile (and possibly a lower performance profile).

In some embodiments described herein, PM circuitry 220 can transition memory controller circuitry 110 and/or the memory device from a first operational state (e.g., operational state S1) to a second operational state (e.g., operational state S2) when a particular condition occurs. Performance values can be measured while memory controller circuitry 110 and/or the memory device transitions from operational state S1 to operational state S2. PM circuitry 220 can then compare the measured performance values with the stored performance values that specify the QoS agreements to determine whether one or more QoS agreements were violated. If one or more QoS agreements were violated, PM circuitry 220 can change the condition so that transitions from operational state S1 to S2 are less frequent. On the other hand, if none of the QoS agreements were violated, PM circuitry 220 can change the condition so that transitions from operational state S1 to S2 are more frequent.

Figure 3A:
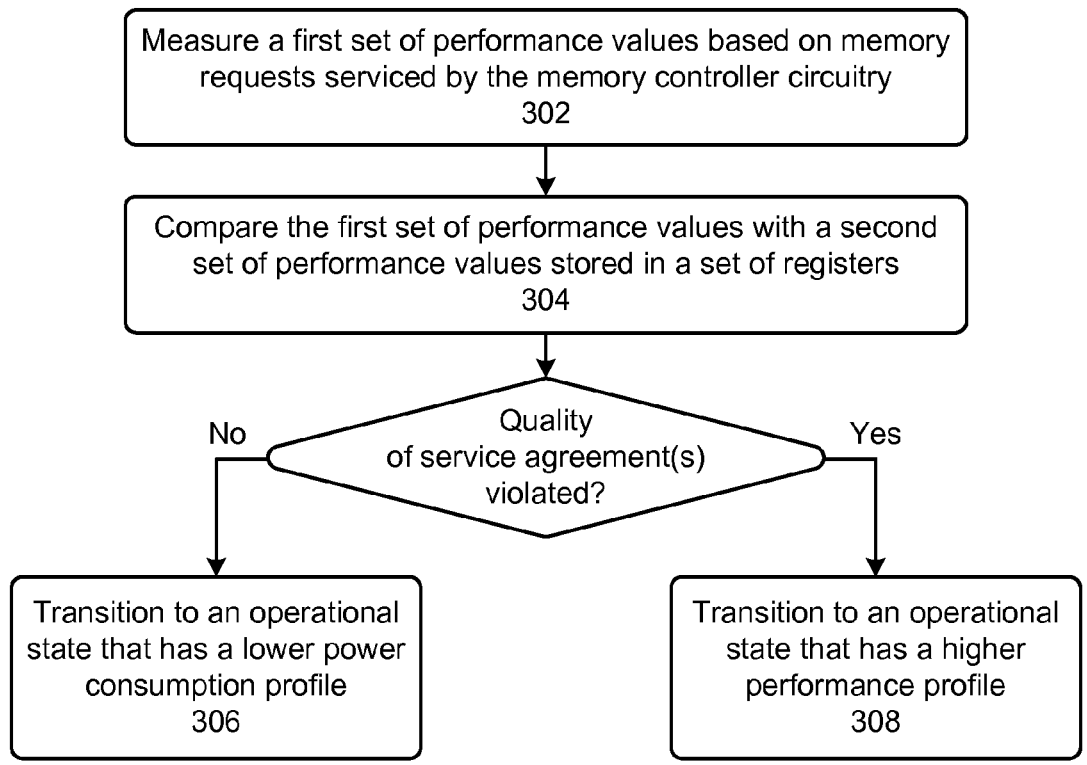
FIG. 3A presents a flowchart that illustrates a process for transitioning from one operational state to another operational state in accordance with some embodiments described in this disclosure.

FIG. 3A presents a flowchart that illustrates a process for transitioning from one operational state to another operational state in accordance with some embodiments described in this disclosure.

In some embodiments described herein, an IC can implement the process illustrated in FIG. 3A. A first set of performance values can be measured based on memory requests serviced by the memory controller circuitry in the IC (operations 302). Next, the first set of performance values can be compared with a second set of performance values stored in a set of registers (operation 304). The second set of performance values may correspond to a set of QoS agreements that is desired to be satisfied.

If the comparison indicates that one or more QoS agreements have been violated, the power management circuitry (e.g., PM circuitry 220) can transition the memory controller circuitry and/or the memory device to an operational state that has a higher performance profile (operation 308). On the other hand, if the comparison indicates that none of the QoS agreements have been violated, the power management circuitry can transition the memory controller circuitry and/or the memory device to an operational state that has a lower power consumption profile (operation 306).

In some embodiments described herein, the memory controller circuitry and/or memory device may be capable of operating at multiple clock frequencies. At lower clock frequencies, the memory controller circuitry and/or memory device may have lower performance profiles and lower power consumption profiles. Conversely, at higher clock frequencies, the memory controller circuitry and/or memory device may have higher performance profiles and higher power consumption profiles.

Figure 3B:
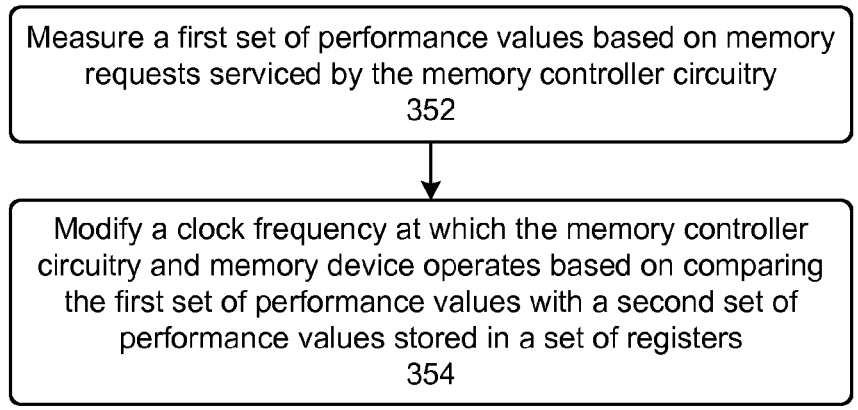
FIG. 3B presents a flowchart that illustrates a specific instance of the process illustrated in FIG. 3A in accordance with some embodiments described in this disclosure.

FIG. 3B presents a flowchart that illustrates a specific instance of the process illustrated in FIG. 3A in accordance with some embodiments described in this disclosure.

The process can begin with the IC measuring a first set of performance values based on memory requests serviced by the memory controller circuitry (operation 352). Next, the IC can modify a clock frequency at which the memory controller circuitry and memory device operates based on comparing the first set of performance values with a second set of performance values stored in a set of registers (operation 354). In some embodiments described herein, if the comparison indicates that one or more QoS agreements have been violated, the clock frequency can be increased. Conversely, if the comparison indicates that none of the QoS agreements has been violated, the clock frequency can be decreased.

Figure 4A:
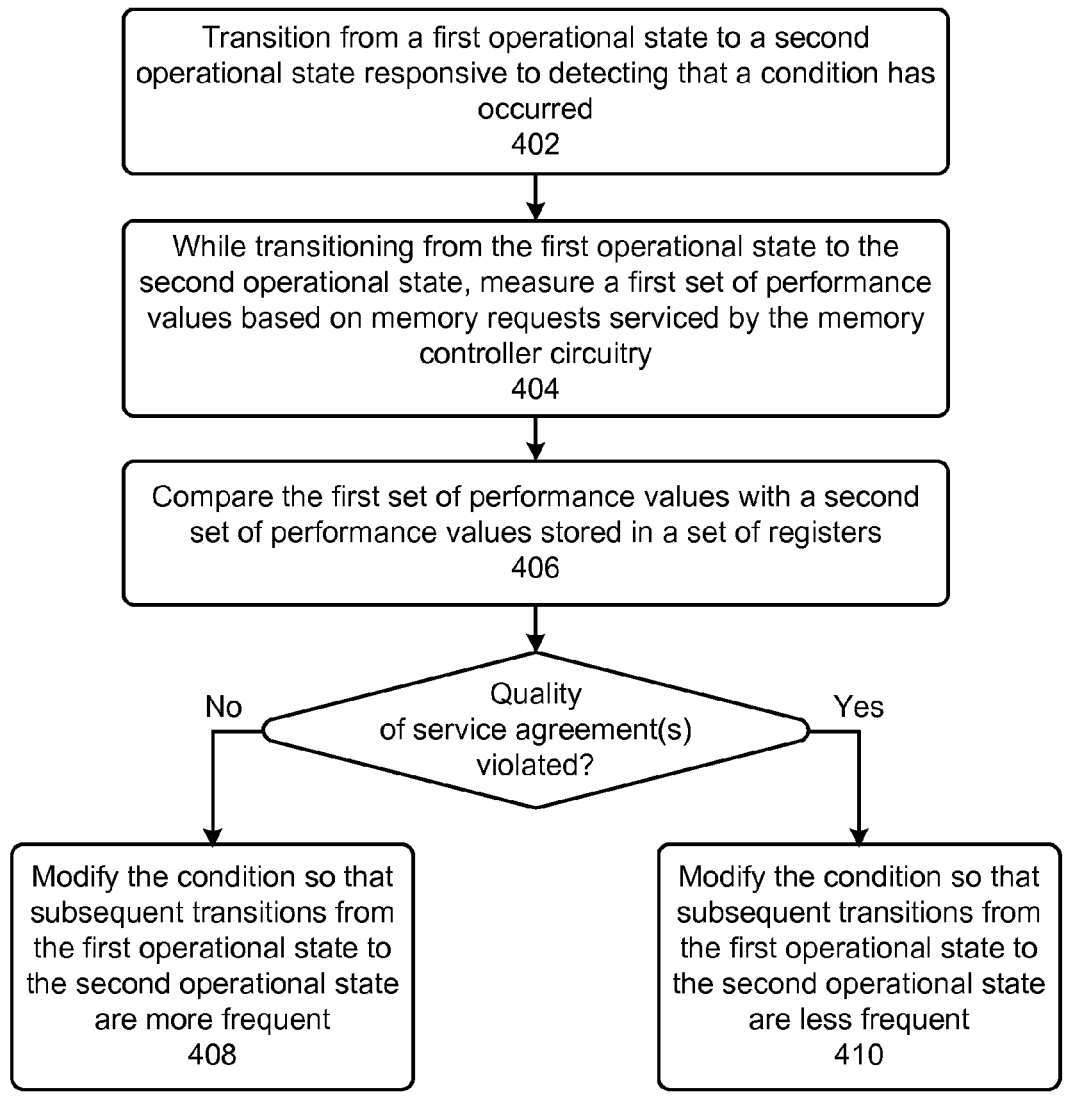
FIG. 4A presents a flowchart that illustrates a process for adaptively modifying a condition for transitioning from one operational state to another operational state in accordance with some embodiments described herein.

FIG. 4A presents a flowchart that illustrates a process for adaptively modifying a condition for transitioning from one operational state to another operational state in accordance with some embodiments described herein.

In some embodiments described herein, an IC can implement the process illustrated in FIG. 4A. The memory controller circuitry and/or the memory device can transition from a first operational state to a second operational state responsive to detecting that a condition has occurred (operation 402). While transitioning from the first operational state to the second operational state, a first set of performance values can be measured based on memory requests serviced by the memory controller circuitry (operation 404). Next, the first set of performance values can be compared with a second set of performance values stored in a set of registers (operation 406). The second set of performance values may correspond to a set of QoS agreements that is desired to be satisfied.

If the comparison indicates that one or more QoS agreements have been violated, the power management circuitry (e.g., PM circuitry 220) can modify the condition so that subsequent transitions from the first operational state to the second operational state are less frequent (operation 410). On the other hand, if the comparison indicates that none of the QoS agreements have been violated, the power management circuitry can modify the condition so that subsequent transitions from the first operational state to the second operational state are more frequent (operation 408).

Figure 4B:
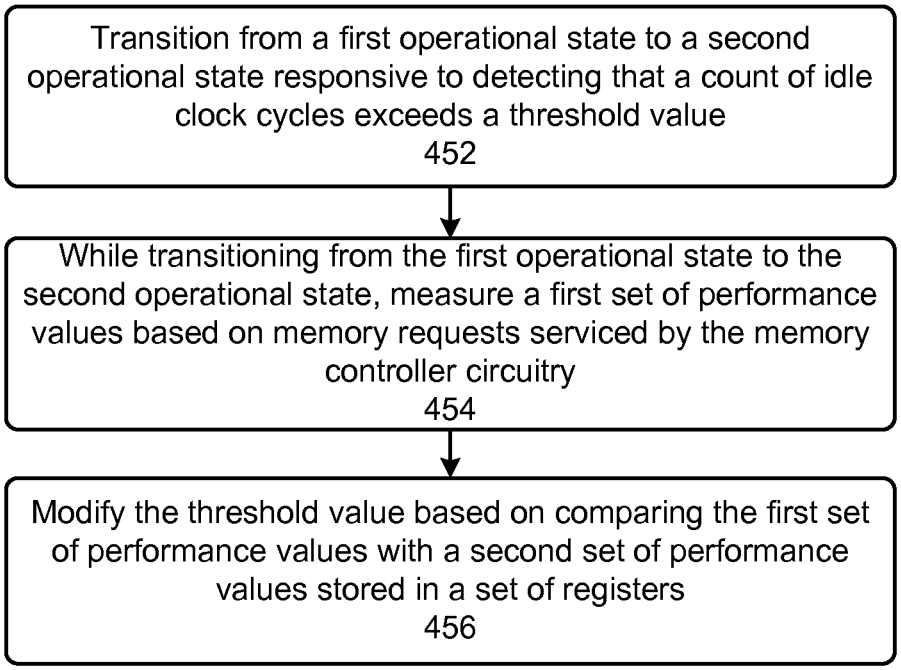
FIG. 4B presents a flowchart that illustrates a specific instance of the process illustrated in FIG. 4A in accordance with some embodiments described in this disclosure.

FIG. 4B presents a flowchart that illustrates a specific instance of the process illustrated in FIG. 4A in accordance with some embodiments described in this disclosure.

The process can begin with memory controller circuitry and/or a memory device coupled to the memory controller circuitry transitioning from a first operational state to a second operational state responsive to detecting that a count of idle clock cycles exceeds a threshold value (operation 452). According to one definition, an idle clock cycle is a clock cycle in which the memory controller circuitry does not receive a memory request from an agent. In some embodiments described herein, on-chip interconnect 204 (shown in FIG. 2) may include a counter that is incremented for each idle clock cycle, and that is reset whenever a memory request is received.

While the memory controller circuitry and/or the memory device is transitioning from the first operational state to the second operational state, a first set of performance values can be measured based on memory requests serviced by the memory controller circuitry (operation 454).

Next, the memory controller circuitry can modify the threshold value based on comparing the first set of performance values with a second set of performance values stored in a set of registers (operation 456). In some embodiments described herein, if the comparison indicates that one or more QoS agreements have been violated, then the threshold can be increased, thereby decreasing the frequency with which the memory controller circuitry is expected to transition from the first operational state to the second operational state. Conversely, if the comparison indicates that none of the QoS agreements has been violated, the threshold can be decreased, thereby increasing the frequency with which the memory controller circuitry is expected to transition from the first operational state to the second operational state.

Figure 5:
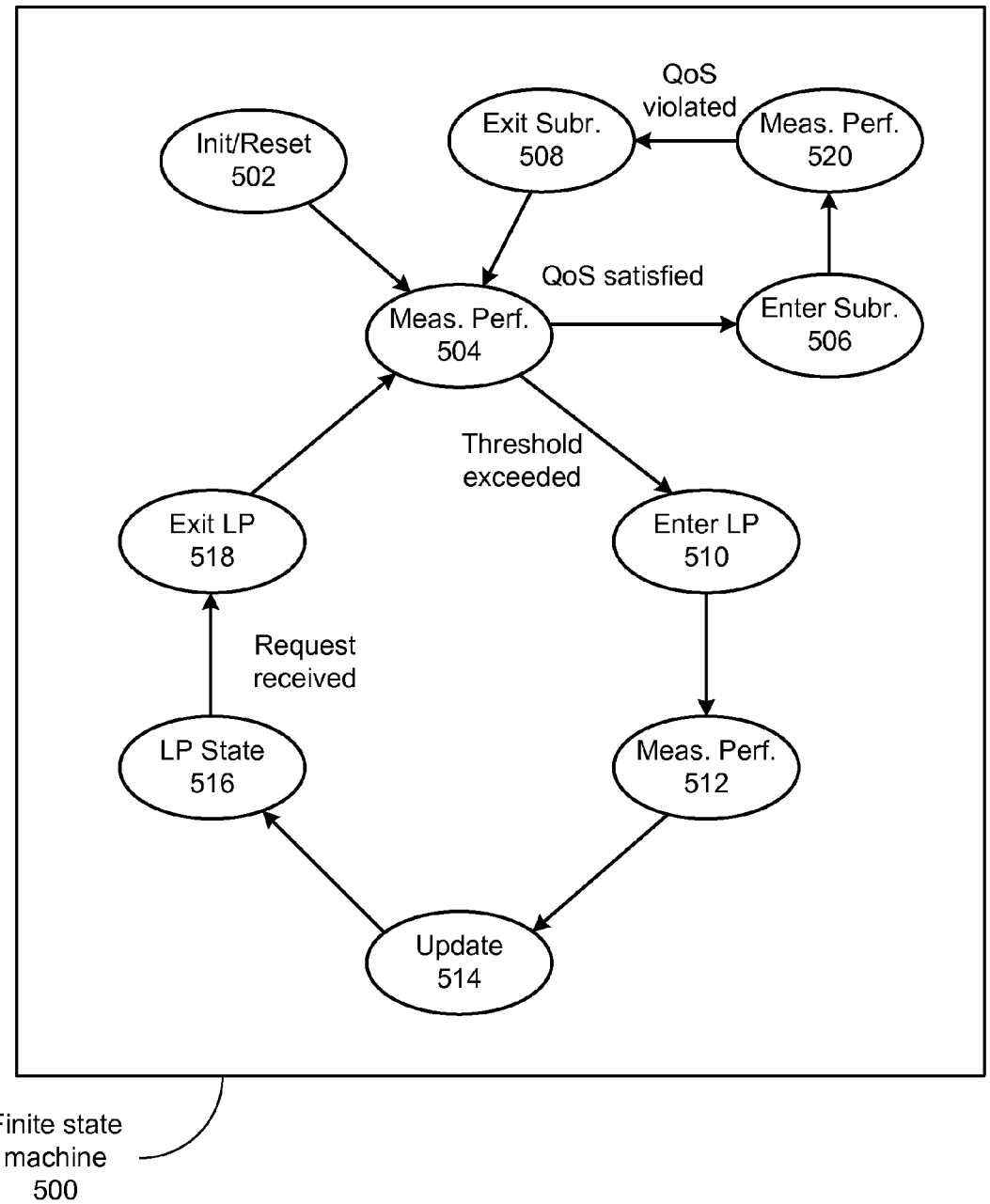
FIG. 5 illustrates a finite state machine (FSM) that, when implemented as a circuit, can be used for adaptive power state management in accordance with some embodiments described herein.

FIG. 5 illustrates an FSM that, when implemented as a circuit, can be used for adaptive power state management in accordance with some embodiments described herein. Specifically, FIG. 5 illustrates an FSM that, when implemented as a circuit, is capable of performing the methods and/or processes shown in FIGS. 3B and 4B.

In some embodiments described herein, FSM 500 can include the following states: (1) state 502 (initialization/reset), (2) state 504 (measure performance), (3) state 506 (enter sub-rate clocking operational state), (4) state 508 (exit sub-rate clocking operational state), (5) state 510 (enter low power operational state), (6) state 512 (measure performance while transitioning between operational states), (7) state 514 (update threshold), (8) state 516 (operate in low power operational state), and (9) state 518 (exit low power operational state).

Upon initialization and/or reset, FSM 500 can begin in state 502. Next, FSM 500 can enter state 504. In state 504, the memory controller circuitry can count idle clock cycles and/or measure performance values. If the measured performance values indicate that none of the QoS agreements were violated, then FSM 500 can enter state 506, and the memory controller circuitry can begin entering a sub-rate clocking operational state. Once the memory controller circuitry completes entering the sub-rate clocking operational state, FSM 500 can move to state 520. In state 520, the memory controller circuitry can measure performance values. If the measured performance values indicate that one or more QoS agreements were violated, FSM 500 can enter state 508, and the memory controller circuitry can begin exiting the sub-rate clocking operational state. Once the memory controller circuitry completes exiting the sub-rate clocking operational state, FSM 500 can move to state 504, and the memory controller circuitry can count idle clock cycles and/or measure performance values.

If the count of idle clock cycles exceeds a threshold, FSM 500 can move to state 510, and the memory controller circuitry can begin entering a low power state. While the memory controller circuitry is entering a low power state, FSM 500 can move to state 512, and the memory controller circuitry can measure performance values. Once the memory controller circuitry completes entering the low power state, FSM 500 can move to state 514, and the memory controller circuitry can stop measuring performance values. In state 514, the memory controller circuitry can update the threshold based on comparing the measured performance values with the stored performance values that specify the QoS agreements. If the measured performance values indicate that one or more QoS agreements were violated, the memory controller circuitry can increase the threshold. On the other hand, if the measured performance values indicate that none of the QoS agreements were violated, the memory controller circuitry can decrease the threshold. Next, FSM 500 can enter state 516 and remain in that state while the memory controller circuitry is in the low power state. When the memory controller circuitry receives a memory request, FSM 500 can move to state 518, and the memory controller circuitry can begin exiting the low power state. Once the memory controller circuitry completes exiting the low power state, FSM 500 can move to state 504, and the memory controller circuitry can start counting idle clock cycles and/or measure performance values.

Figure 6:
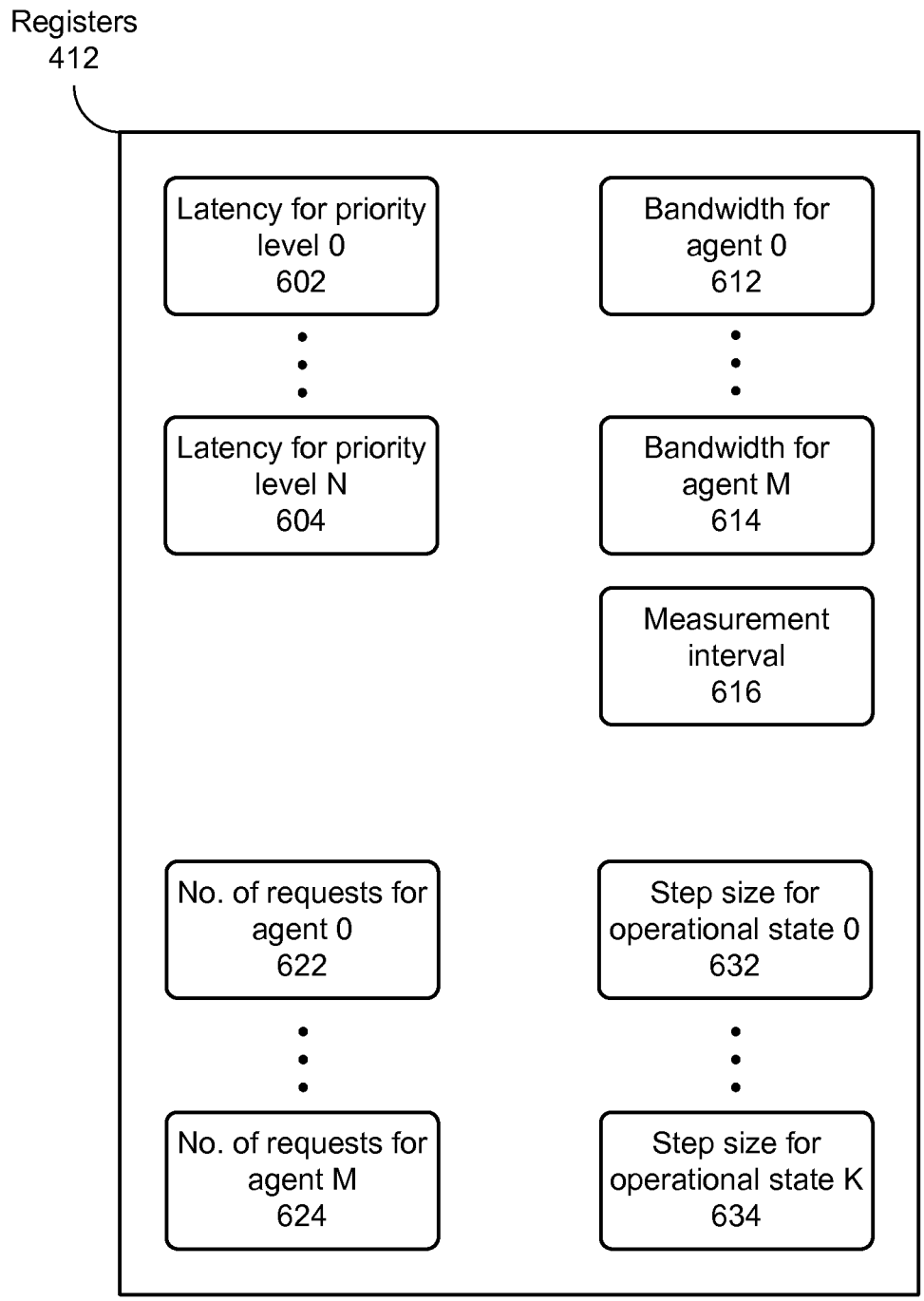
FIG. 6 illustrates an example of some registers that can be used for adaptive power state management in accordance with some embodiments described herein.

FIG. 6 illustrates an example of some registers that can be used for adaptive power state management in accordance with some embodiments described herein.

Memory controller circuitry (e.g., memory controller circuitry 110) can include a set of registers (e.g., registers 412) that can store various values that the memory controller circuitry can use for adaptive power state management.

In some embodiments described herein, registers 412 can include registers 602-604 to store latency values, registers 612-614 to store bandwidth values, register 616 to store a measurement interval, registers 622-624 to store a count of memory requests, and registers 632-634 to store step sizes.

In some embodiments described herein, registers 602-604 can store a latency value (e.g., a maximum or average latency value) for each priority level. The memory controller circuitry can measure latency for servicing each memory request and keep track of the maximum and/or average latency values for each priority level. The memory controller circuitry can then compare the measured latency values with the values stored in registers 602-604 to determine whether or not a latency agreement was violated.

In some embodiments described herein, registers 612-614 can store a minimum bandwidth value for each agent. The memory controller circuitry can measure the bandwidth that is being provided to each agent. The memory controller circuitry can then compare the measured bandwidth values with the values stored in registers 612-614 to determine whether or not the a bandwidth agreement was violated. In some embodiments, the memory controller circuitry can use the measurement interval value stored in register 616 to measure the bandwidth provided to each agent.

In some embodiments described herein, registers 622-624 can store a maximum number of outstanding memory requests for each agent. The memory controller circuitry can measure the number of outstanding memory requests for each agent, and then compare the measured values with the maximum values stored in registers 622-624 to determine whether or not the a maximum number of outstanding memory requests agreement was violated.

In some embodiments described herein, registers 632-634 can store step sizes (i.e., increment values) that can be used to adjust a threshold associated with each low power operational state. In some embodiments described herein, the memory controller circuitry may enter a low power operational state responsive to detecting that a count of idle cycles has exceeded a threshold. Next, the memory controller circuitry may use the measured performance values to determine whether to increase or decrease the threshold value. Next, the memory controller circuitry can use the step size value (i.e., the increment value) stored in registers 632-634 that is associated with the low power state to increase or decrease the threshold value.

The methods and/or processes described in this disclosure can be embodied in hardware, software, or a combination thereof. Hardware embodiments include, but are not limited to, IC chips, field-programmable gate arrays (FPGAs), and other programmable-logic devices now known or later developed.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:

1. An integrated circuit (IC) that controls the operation of a memory device, the IC comprising:
   first circuitry capable of transitioning from a first operational state to a second operational state responsive to detecting that a condition has occurred;
   second circuitry capable of measuring a first set of performance values based on memory requests serviced by the IC; and third circuitry capable of modifying the condition based on comparing the first set of performance values with a second set of performance values stored in a set of registers.

2. The IC of claim 1, wherein the power consumption profile of the IC in the first operational state is different from the power consumption profile of the IC in the second operational state.

3. The IC of claim 1, wherein the second circuitry is capable of measuring the first set of performance values while the IC is transitioning from the first operational state to the second operational state, and wherein the third circuitry is capable of modifying the condition when the IC is in the second operational state.

4. The IC of claim 1, wherein the third circuitry is capable of modifying the condition so that subsequent transitions from the first operational state to the second operational state are more frequent if the first set of performance values meets a set of quality of service agreements specified by the second set of performance values, and wherein the third circuitry is capable of modifying the condition so that subsequent transitions from the first operational state to the second operational state are less frequent if the first set of performance values does not meet the set of quality of service agreements specified by the second set of performance values.

5. The IC of claim 1, wherein the first set of performance values include at least one of:
   a bandwidth value;
   a count of outstanding memory requests; or
   a latency value.

6. The IC of claim 1, further comprising a second register that stores a measurement interval value that is used by the second circuitry to measure at least some of the first set of performance values.

7. The IC of claim 1, wherein an agent accesses the memory device, and wherein the agent is one of:
   a central processing unit;
   a graphics processing unit;
   a network processor;
   a cryptographic accelerator;
   a peripheral controller;
   a display controller;
   a video codec;
   an audio codec;
   a direct memory access controller;
   a digital signal processing core; or
   a hardware accelerator.

8. The IC of claim 7, wherein at least a part of the second circuitry resides in the agent.

9. The IC of claim 1, wherein the memory device is one of:
   a dynamic random access memory device;
   a static random access memory device; or
   a flash memory device.

10. The IC of claim 1, wherein the condition occurs when a count of idle clock cycles exceeds a threshold value stored in a first register, and wherein modifying the condition includes modifying the threshold value stored in the first register.

11. The IC of claim 10, wherein the third circuitry is capable of decreasing the threshold value stored in the first register if the first set of performance values meets a set of quality of service agreements specified by the second set of performance values, and wherein the third circuitry is capable of increasing the threshold value stored in the first register if the first set of performance values does not meet the set of quality of service agreements specified by the second set of performance values.

12. The IC of claim 10, further comprising a second register that stores an increment value that is used by the third circuitry to modify the threshold value.

13. The IC of claim 1, further comprising:
   fourth circuitry capable of transitioning the IC to a third operational state that has a lower power consumption profile than the first operational state or a higher performance profile than the first operational state based on comparing the first set of performance values with the second set of performance values stored in the set of registers.

14. The IC of claim 13, wherein the fourth circuitry is capable of decreasing the clock frequency at which the memory device operates if the first set of performance values meets a set of quality of service agreements specified by the second set of performance values, and wherein the fourth circuitry is capable of increasing the clock frequency at which the memory device operates if the first set of performance values does not meet a set of quality of service agreements specified by the second set of performance values.

15. An integrated circuit (IC) that controls the operation of a memory device, the IC comprising:
   first circuitry capable of measuring, in a first operational state, a first set of performance values based on memory requests serviced by the IC; and
   second circuitry capable of transitioning the IC from the first operational state to a second operational state that has a lower power consumption profile than the first operational state or a higher performance profile than the first operational state based on comparing the first set of performance values with a second set of performance values stored in a set of registers.

16. The IC of claim 15, wherein second circuitry is capable of modifying a clock frequency at which the memory device operates.

17. The IC of claim 16, wherein the second circuitry is capable of decreasing the clock frequency if the first set of performance values meets a set of quality of service agreements specified by the second set of performance values, and wherein the second circuitry is capable of increasing the clock frequency if the first set of performance values does not meet a set of quality of service agreements specified by the second set of performance values.

18. A method, comprising:
   transitioning an IC from a first operational state to a second operational state responsive to detecting that a condition has occurred;
   measuring a first set of performance values based on memory requests serviced by the IC while transitioning from the first operational state to the second operational state; and
   modifying the condition based on comparing the first set of performance values with a second set of performance values stored in a set of registers.

19. The method of claim 18, further comprising:
   measuring a third set of performance values based on requests serviced by the IC while the IC is in the first operational state; and
   transitioning the IC from the first operational state to a third operational state that has a lower power consumption profile than the first operational state or a higher performance profile than the first operational state based on comparing the third set of performance values with the second set of performance values stored in the set of registers.

20. A method, comprising:
    measuring a first set of performance values based on requests serviced by an IC while the IC is in a first operational state; and
    transitioning the IC from the first operational state to a second operational state that has a lower power consumption profile than the first operational state or a higher performance profile than the first operational state based on comparing the first set of performance values with a second set of performance values stored in a set of registers.

21. The method of claim 20, wherein transitioning the IC from the first operational state to a second operational state includes modifying a clock frequency at which a memory device controlled by the IC operates.

22. A system-on-a-chip (SoC), comprising:
    first circuitry capable of controlling the operation of a memory device;
    an agent that is capable of sending memory requests to the first circuitry;
    second circuitry capable of transitioning the first circuitry from a first operational state to a second operational state responsive to detecting that a condition has occurred;
    third circuitry capable of measuring a first set of performance values based on memory requests serviced by the first circuitry; and
    fourth circuitry capable of modifying the condition based on comparing the first set of performance values with a second set of performance values stored in a set of registers.

23. A system-on-a-chip (SoC), comprising:
    first circuitry capable of controlling the operation of a memory device;
    an agent that is capable of sending memory requests to the first circuitry;
    second circuitry capable of measuring, in a first operational state, a first set of performance values based on memory requests serviced by the first circuitry; and
    third circuitry capable of transitioning the first circuitry from the first operational state to a second operational state that has a lower power consumption profile than the first operational state or a higher performance profile than the first operational state based on comparing the first set of performance values with a second set of performance values stored in a set of registers.

* * * * *